United States Patent [19]

Thibault et al.

[11] 4,136,434
[45] Jan. 30, 1979

[54] FABRICATION OF SMALL CONTACT OPENINGS IN LARGE-SCALE-INTEGRATED DEVICES

[75] Inventors: Louis R. Thibault, Piscataway; Leopoldo D. Yau, New Providence, both of N.J.

[73] Assignee: Bell Telephone Laboratories, Incorporated, Murray Hill, N.J.

[21] Appl. No.: 805,408

[22] Filed: Jun. 10, 1977

[51] Int. Cl.² ............................................. B01J 17/00
[52] U.S. Cl. ........................................ 29/571; 29/578
[58] Field of Search ................. 29/571, 578, 590, 591, 29/625, 626, 628; 357/59; 204/15, 56 R; 361/414

[56] References Cited

U.S. PATENT DOCUMENTS

| | | | |
|---|---|---|---|
| 3,761,327 | 9/1973 | Harlow | 357/54 |
| 3,764,491 | 10/1973 | Schwartz | 204/56 R |
| 3,775,262 | 11/1973 | Heyerdahl | 204/15 |
| 3,950,188 | 4/1976 | Bower | 357/59 |

Primary Examiner—W. Tupman
Attorney, Agent, or Firm—Lucian C. Canepa

[57] ABSTRACT

In one embodiment, a relatively thin layer of polysilicon is deposited on an underlying region to which spaced-apart electrical contacts are to be made through a subsequently formed relatively thick insulating layer. The polysilicon is selectively masked by a patterned silicon nitride layer in the regions where contact windows are to be formed. The unmasked polysilicon is then converted to a relatively thick insulating layer in an oxidizing step. Thereafter the silicon nitride portions are removed and the remaining polysilicon is utilized to provide conductive regions in the defined windows. In another embodiment, a relatively thick layer of polysilicon is selectively masked and partially converted to silicon dioxide to define both the insulating layer and the conductive regions. In still another embodiment, a relatively thin layer of polysilicon is patterned and then entirely converted to silicon dioxide to form an insulating layer having windows defined therein.

2 Claims, 12 Drawing Figures

FABRICATION OF SMALL CONTACT OPENINGS IN LARGE-SCALE-INTEGRATED DEVICES

BACKGROUND OF THE INVENTION

This invention relates to reliable high resolution patterning techniques and more particularly to the fabrication of small contact openings in large-scale-integrated (LSI) devices.

Opening very small contact windows in a relatively thick insulating layer to gain access to an underlying region is a significant problem and sometimes a limiting factor in making LSI devices such as metal-oxide-semiconductor (MOS) random access memories. Some standard MOS LSI devices include, for example, a one-micron-thick insulating layer through which the contact openings must be made. Wet chemical etching is commonly used to open windows in this insulating layer, with a patterned positive resist serving as the etching mask. But, due to undercutting during the wet etching process, it has been found difficult in practice to delineate contact windows smaller than about 4-by-4 microns.

Standard plasma etching techniques are also available for forming contact windows in LSI devices. But, since a suitable plasma-etch-resistant positive electron resist is not presently available, plasma etching is not a feasible technique for making contact windows while directly processing devices by high-resolution electron lithography. Moreover, even if such an electron resist were available, the insulating layer to be plasma etched is so relatively thick that achieving high resolution therein via a patterned resist layer is exceedingly difficult.

Accordingly, efforts have been directed at trying to devise alternative techniques capable of making very small contact windows in LSI devices in a highly reliable manner. It was recognized that the availability of such techniques, particularly if included in a high-resolution electron lithography process, would significantly advance the art of making LSI devices.

SUMMARY OF THE INVENTION

Hence, an object of the present invention is an improved fabrication sequence for making LSI devices. More specifically, an object of this invention is a technique for forming very small contact openings in such devices.

Briefly, these and other objects of the present invention are realized in a specific illustrative fabrication sequence directed at opening very small contact windows in a relatively thick insulating layer to gain access to an underlying region. In accordance with one specific illustrative basic aspect of the invention, a relatively thin layer of polysilicon is deposited on the underlying region. In turn, the polysilicon is selectively masked by a patterned silicon nitride layer in those regions where contact windows are to be formed. The unmasked polysilicon is then converted to a relatively thick insulating layer in an oxidizing step. Thereafter, the silicon nitride portions are removed and the remaining polysilicon is utilized to provide conductive regions in the defined windows. In another embodiment, a relatively thick layer of polysilicon is selectively masked and partially converted to silicon dioxide to define both the underlying region and the conductive regions. In still another embodiment, a relatively thin layer of polysilicon is patterned and then entirely converted to silicon dioxide to form an insulating layer having windows defined therein.

BRIEF DESCRIPTION OF THE DRAWING

A complete understanding of the present invention and of the above and other objects, features and advantages thereof may be gained from a consideration of the following detailed description presented hereinbelow in connection with the accompanying drawing, in which.

DETAILED DESCRIPTION

Figure 1:
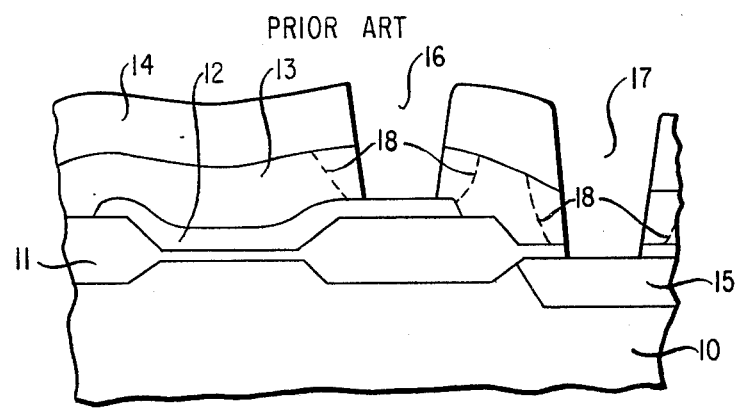
FIG. 1 is a cross-sectional side view of a portion of a partially fabricated conventional MOS LSI device made in accordance with known techniques.

FIG. 1 shows in cross-sectional side view a portion of a partially fabricated conventional MOS LSI device that includes a multiplicity of field-effect transistors each including gate, source and drain electrodes. The depicted portion includes a p-type silicon substrate 10, a layer of silicon dioxide 11, a doped polysilicon portion 12 that serves as the gate electrode of one transistor, a so-called intermediate insulator 13 made of silicon dioxide or phosphorus-doped silicon dioxide, a layer 14 made of a suitable positive photo-, electron- or X-ray-resist material and a diffused or implanted n+ region 15 that serves as the source or drain electrode of another transistor in the LSI array. In one typical such LSI device of practical importance, the thickness of the intermediate insulating layer 13 is about one micron.

In FIG. 1, two idealized contact windows or openings 16, 17 are shown as having been made through the resist layer 14 and the insulating layer 13. In subsequent processing steps, a metallic layer (not shown) is deposited on the insulating layer 13 and in the openings 16, 17. After being suitably patterned, this metallic layer establishes selective electrical connections to the various gate, source and drain electrodes of the herein-considered MOS device, in a manner well known in the art.

As indicated earlier above, the openings in the layer 13 of FIG. 1 are typically made either by wet chemical etching or by plasma etching. If wet etching is employed, undercutting occurs (indicated by dashed lines 18). And, even if a suitable plasma-etch-resistant positive resist is available, the problems involved in making very small openings in the relatively thick layer 13 by plasma etching are formidable, as indicated above.

In accordance with the principles of the present invention, a unique processing sequence is prescribed to establish very small contact openings in an LSI device. For purposes of a specific illustrative example, applicants' processing sequence will be described hereinbelow as applied to the fabrication of a particular MOS LSI device. But it is to be understood that applicants' inventive concepts are general purpose in nature and may also be applied, for example, to the batch fabrication of other microminiature devices such as bipolar LSI arrays.

Moreover, although applicants' inventive techniques are applicable to fabricating devices by any lithographic process, it has been found particularly advantageous to employ applicants' techniques in conjunction with electron beam lithographic processes. One exemplary apparatus with which to carry out electron beam lithography is described in U.S. Pat. No. 3,900,737, issued Aug. 19, 1975, to R. J. Collier and D. R. Herriott, entitled "Electron Beam Exposure System." With such a computer-controlled system, it is feasible to precisely delineate the successive patterns required to fabricate LSI devices. Feature dimensions of only a few microns or less and alignment tolerances less than one micron are thereby achievable.

An advantageous modification of the Collier-Herriott system is described in a commonly assigned copending application of R. J. Collier and M. G. R. Thomson, Ser. No. 655,427, filed Feb. 5, 1976. In this modification, the pattern-writing speed of the system is significantly increased by utilizing a new mode of raster scanning. In the new mode, the writing spot dimensions of the scanning electron beam are varied in a high-speed way during the raster scanning process.

The systems described in the aforecited Collier-Herriott patent and in the Collier-Thomson application may be utilized to fabricate a set of high-precision masks. In turn, the masks are employed in succession in connection with standard photolithographic or X-ray-lithographic techniques to define prescribed patterns on an associated resist-coated wafer. In that way, an MOS LSI device of the type described herein may be fabricated.

Alternatively, a system of the type described in the Collier-Herriott patent or in the Collier-Thomson application may be operated in a so-called direct writing mode. In that mode, an electron-resist-coated wafer is directly irradiated in a high-speed way by a scanning electron beam to define high-resolution features. Hereinafter, for illustrative purposes it will be assumed that the particular MOS LSI devices to be described herein are fabricated by utilizing an electron beam exposure system operating in its direct writing mode. In practice, advantageous LSI devices embodying applicants' inventive concepts have been thereby achieved.

Figure 2:
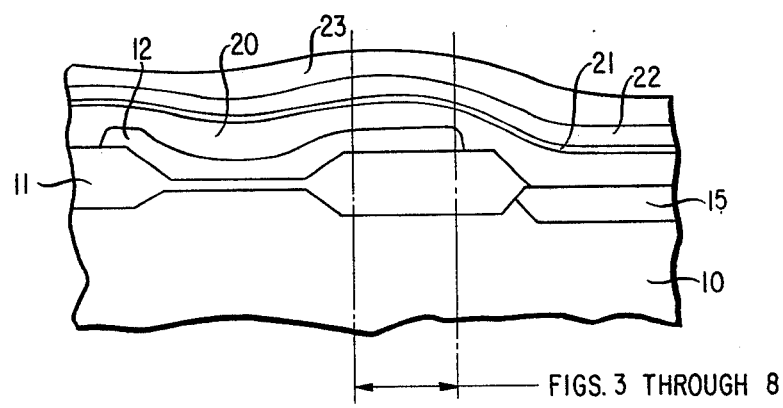
FIG. 2 is a cross-sectional side view of a portion of a specific illustrative multilayered structure made in accordance with one basic aspect of the principles of the present invention.

FIG. 2 shows a specific illustrative multilayered structure made in accordance with the principles of the present invention. To more clearly show the partial correspondence between FIGS. 1 and 2, certain elements therein have been assigned the same reference numerals. Thus, FIG. 2 also includes a p-type silicon substrate 10, a layer of silicon dioxide 11, a doped polysilicon portion 12 that serves as the gate electrode of one transistor and a diffused or implanted $n^+$ region 15 that serves as the source or drain electrode of another transistor in an MOS LSI array.

In accordance with one basic aspect of this invention, the layer 20 overlying the gate electrode 12 and the source or drain electrode 15 of FIG. 2 comprises a relatively thin layer of polysilicon. The layer 20, which is deposited in standard ways known in the art, may be made of doped or undoped polysilicon. In some cases of practical interest, it has been found that undoped polysilicon can be patterned more easily and more precisely than doped polysilicon. Accordingly, for illustrative purposes only herein, the layer 20 will be assumed to be initially undoped. Significantly, for the case wherein the final thickness of the intermediate insulating layer of the device to be fabricated is specified to be about one micron, the initial thickness of the polysilicon layer 20 need be only about 0.5 microns.

Overlying the polysilicon layer 20 of FIG. 2 are an optional thin layer 21 of silicon dioxide (for example about 200 Angstrom units thick) and a thin layer 22 of silicon nitride (for example about 1000 Angstrom units thick). Alternatively, the layer 22 may comprise a thin layer of aluminum oxide. (Hereinafter, however, for purposes of a specific illustrative example, the layer 22 will be assumed to be made of silicon nitride.) Finally, the topmost layer 23 comprises a suitable negative electron resist such as polyglycidyl methacrylate-co-ethyl acrylate which will be designated hereinafter as COP. Illustratively, the COP layer 23 is about 0.5 microns thick. (A description of COP is contained in an article by L. F. Thompson, J. P. Ballantyne and E. D. Feit, entitled "Molecular Parameters and Lithographic Performance of Polyglycidal Methacrylate-co-Ethyl Acrylate: A Negative Electron Resist," *Journal of Vacuum Science and Technology*, Volume 12, pages 1280–1283, 1975.)

To simplify the drawing and the accompanying subsequent description herein, FIGS. 3 through 8 show only a portion of the multilayered structure of FIG. 2. More specifically, each of FIGS. 3 through 8 is a side view of only that portion of FIG. 2 located between the indicated reference lines and arrowheads. Thus, FIGS. 3 through 8 illustrate various steps in the process of establishing a contact window to gain access to the gate electrode 12 of FIG. 2. It will be apparent that these very same steps are also effective to establish a contact opening to the source or drain electrode 15 as well as to each of the multiple other electrodes included in the overall LSI device.

By standard electron beam lithographic techniques, the negative electron resist layer 23 of FIG. 2 is selectively irradiated to expose very small contact window regions (each measuring, for example, about 2-by-2 microns). These regions are formed in registry with and directly above the multiple gate, source and drain electrodes of the herein-represented MOS LSI device.

The unexpected portions of the resist layer 23 of FIG. 2 are then removed from the depicted structure by a suitable solvent such as a 5:1:8 mixture of methyl ethyl ketone:ethanol. One of the resist portions remaining on the structure after this removal step is shown in FIG. 3 and designated with reference numeral 25.

Thereafter, those portions of the silicon nitride layer 22 (FIG. 3) that are not masked by overlying regions of COP resist are removed. Removal is accomplished either by wet chemical etching (with, for example, hot phosphoric acid) or preferably by plasma etching. Illustratively, plasma etching in a 96:4 atmosphere of carbon tetrafluoride:oxygen has been found to be effective for this purpose. If plasma etching is used, the layer 21 of silicon dioxide (FIG. 3) serves to protect the underlying polysilicon layer 20 from being etched. But the layer 21 is not absolutely necessary. If this optional layer is not included in the depicted structure, etching of the layer 20 can be avoided or reduced to an acceptable level by careful control and monitoring of the etching process.

Significantly, the aforespecified silicon nitride layer 22 is in practice advantageously made to be extremely thin. Accordingly, it is feasible to use a relatively thin resist layer as a masking material therefor. As a result, very-high-resolution patterns can be formed in the layer 22. In turn, this serves as a basis for forming very small contact windows in LSI devices.

Figure 3:
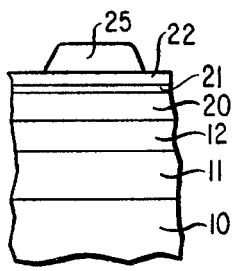
FIGS. 3 through 8 are successive side views of a portion of the FIG. 2 structure as the structure is processed in accordance with the principles of this invention.

After removing the unmasked portions of the silicon nitride layer 22, the exposed resist regions such as the region 25 of FIG. 3 are removed. This latter removal is done, for example, in a standard oxygen plasma stripping step. At that point in the process, the structure has the form represented in FIG. 4. One silicon nitride region 26, patterned in the manner described above, is shown in FIG. 4.

Subsequently, in accordance with one basic aspect of the principles of the present invention, the relatively thin polysilicon layer 20 (FIG. 4) is converted to a relatively thick layer of silicon dioxide except where the layer 20 is masked by overlying regions of silicon nitride. In the underlying or masked regions of the layer 20, the polysilicon is not converted to silicon dioxide.

Illustratively, conversion of the aforespecified polysilicon to silicon dioxide is carried out in a high-pressure wet-oxygen atmosphere. For example, in a steam atmosphere of oxygen at a pressure of about 20 atmospheres and a temperature of about 700° C., a 0.5 micron-thick layer of polysilicon was converted to a 1-micron-thick layer of silicon dioxide in about 1 hour. (A description of high-pressure steam oxidation is contained in an article by R. J. Powell, J. R. Ligenza and M. S. Schneider, entitled "Selective Oxidation of Silicon in Low-Temperature High-Pressure Steam," *IEEE Transactions on Electronic Devices*, ED-21, pages 636–640, 1974.)

Moreover, if the effect of prolonged higher-temperature oxidation is not detrimental to the device being processed, the aforespecified conversion of polysilicon to silicon dioxide in accordance with this invention can be carried out at lower steam pressures such as at one atmosphere which is characteristic of the standard steam oxidation process well known in the art.

Figure 4:
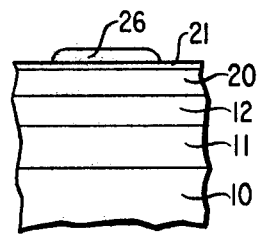
Figure 5:
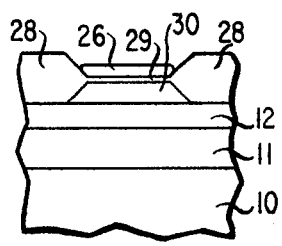

The converted portions of the polysilicon layer 20 of FIG. 4 are shown in FIG. 5 and designated with reference numeral 28. These converted portions encompass those parts of the previously discrete layer 21 that do not underlie the silicon nitride region 26. The part of the layer 21 underlying the region 26 is designated 29 in FIG. 5. And the part of the polysilicon layer 20 underlying the region 26 and the part 29 is designated 30.

In practice, it has been observed that during the aforementioned growing process in which polysilicon is converted to silicon dioxide, peripheral portions of the region 26 (FIG. 5) lift up slightly from the underlying layer. This lifting action, which is both limited in extent and reproducible, permits peripheral portions of the polysilicon underlying the region 26 to be converted to silicon dioxide. As a result, the window actually defined by the silicon dioxide portions 28 in FIG. 5 is in practice slightly smaller than the opening originally defined by the resist region 25. This is an important and advantageous characteristic of the herein-described fabrication procedure. In one particular embodiment made in accordance with this procedure, the region 25 (FIG. 3) measured about 2-by-2 microns whereas the opening actually defined by the converted regions 28 (FIG. 5) measured about 1.5-by-1.5 microns. In this way, it is possible to make contact windows that are actually smaller than the resolution capabilities of the standard lithographic and processing steps included in applicants' overall procedure.

Next, the silicon nitride region 26 and the thin silicon dioxide portion 29 shown in FIG. 5 are removed by standard techniques. By way of example, the region 26 is removed by wet chemical etching or by plasma etching, and the portion 29 is removed by wet chemical etching (for example in buffered hydrofluoric acid).

At that point in the process the polysilicon region 30 of FIG. 5 is accessible from the top side of the depicted structure. In a conventional way, a suitable impurity such as phosphorus is then ion implanted or diffused into the region 30. This makes the region 30 sufficiently conductive to serve as an electrical member in contact with the gate electrode 12. In addition, this last-mentioned step serves to getter metallic impurities from the substrate 10, thereby to improve the characteristics of the junctions formed in the MOS LSI device being fabricated.

Figure 6:
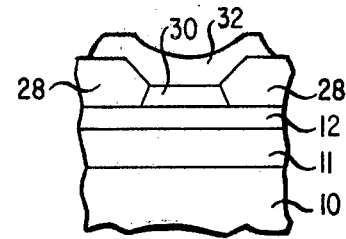

Subsequently, a suitable metallic layer such as a 0.7-micron-thick layer of aluminum is deposited on the entire top surface of the herein-considered structure. By standard lithographic techniques, the aluminum layer is then selectively patterned to define electrical conductors on the top surface of the structure. One such conductor 32 is shown in FIG. 6. As indicated, the conductor 32 establishes an electrical connection to the gate electrode 12 via the conductive polysilicon region 30.

In accordance with a specific illustrative alternative embodiment of the principles of the present invention, it is advantageous in some cases of practical interest to modify the procedure described above. In the modified procedure, a thin layer of doped or undoped polysilicon is deposited on the top surface of the FIG. 5 structure after removing the portions 26 and 29 therefrom. Illustratively, a polysilicon layer 1000-to-2000 Angstrom units thick is deposited thereon. The purpose of this layer is to ensure preservation of the size of the contact window during subsequent processing steps. Otherwise these steps might tend to enlarge the window by removing surface portions from the intermediate insulating layer 28.

Figure 7:
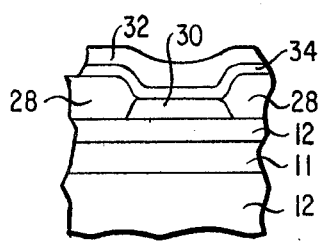

As shown in FIG. 7, the aforespecified thin layer of polysilicon (designated by reference numeral 34) is subsequently patterned to correspond with the patterned conductor 32. In one particular processing sequence, the aforementioned aluminum layer was patterned by wet chemical etching (for example with a standard mixture of phosphoric, nitric and acetic acids) and then the thin polysilicon layer was correspondingly patterned by plasma etching (for example with a 96:4 mixture of carbon tetrafluoride:oxygen).

In accordance with another specific aspect of the principles of the present invention, the aforedescribed fabrication procedure can be further modified. In the modified procedure, two additional optional layers are involved. These additional layers are initially deposited on top of each other between the gate electrode 12 and the polysilicon layer 20 of the structure shown in FIG. 3. Such a modified structure is shown in FIG. 8 wherein layer 36 comprises a layer of silicon dioxide about 200 Angstrom units thick and layer 37 comprises a layer of silicon nitride about 1000 Angstrom units thick.

Figure 8:
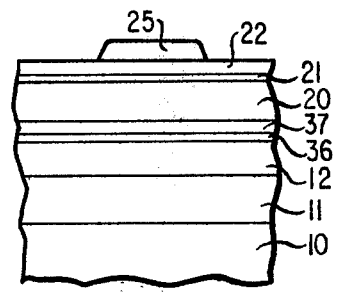

The optional layer 37 shown in FIG. 8 serves to ensure that no portion of the polysilicon gate electrode 12 will be converted to silicon dioxide during the aforedescribed oxidizing step in which unmasked portions of the polysilicon layer 20 are converted to silicon dioxide. And the optional layer 36 serves as a stop layer to protect the underlying gate electrode 12 in the event that the layer 37 is patterned by plasma etching with, for example, a carbon tetrafluoride:oxygen mixture.

In those embodiments in which the layers 36 and 37 of FIG. 8 are included, it is, of course, necessary that the unconverted portion of the polysilicon layer 20, as well as the portions of the layers 36 and 37 underlying the unconverted portion, be removed to enable access via the contact windows to the electrodes of the device. In that case, portions of the subsequently deposited and patterned metallic layer extend into the contact windows of the device and make direct electrical connections to the electrodes thereof such as the gate electrode 12 shown in FIG. 8. And, if desired, an appropriately doped thin protective layer of polysilicon may be interposed between the metallic layer and the underlying portions of the structure, in a manner similar to that previously specified above.

Figure 9:
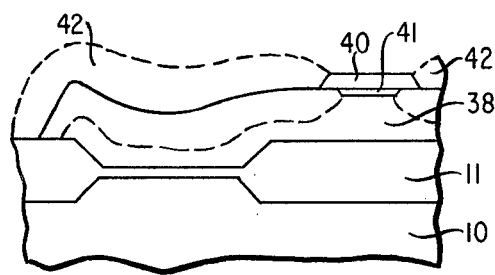
FIG. 9 shows another specific illustrative structure made in accordance with other basic aspects of the principles of this invention.

Still another alternative process for making small contact windows in accordance with the principles of this invention is represented by FIG. 9. In accordance with this alternative process, a relatively thick patterned layer 38 of polysilicon is formed on the silicon dioxide region 11. Illustratively, the layer 38 is about 1 micron thick. Further, as indicated in FIG. 9, a small-area region 40 made, for example, of silicon nitride is formed on the top surface of the layer 38 to define a contact window to be established in the layer 38. As an option, a thin silicon dioxide layer 41 may be interposed between the region 40 and the layer 38 to serve as an etch stop to preserve the layer 38 during later removal of the region 40.

Subsequently, about one-half of the polysilicon layer 38 of FIG. 9 is converted to silicon dioxide in, for example, a wet steam oxidizing step of the type specified above. The silicon dioxide regions that are so formed are indicated in FIG. 9 within dashed lines and are designated by reference numeral 42. Significantly, as seen in FIG. 9, the unconverted portion of the layer 38 comprises a gate electrode having a small-area upper portion to which electrical contact can later easily be made.

Thereafter, the region 40 of FIG. 9 and any silicon dioxide layer thereunder are removed from the depicted structure. At that point, a thin protective polysilicon layer (not shown) may be deposited on the top surface of the structure. A suitable dopant may then be added to the unconverted portion of the layer 38 to both render the portion more conductive and, as specified above, to getter impurities from the structure and thereby improve the junction characteristics of the device being fabricated.

In practice, it has been observed that the relatively simple procedure described immediately above gives precisely reproducible results. By this simple procedure, the original layer 38 of FIG. 9 is converted to define both a relatively thick intermediate insulating layer and a gate electrode. Moreover, the gate electrode is advantageously defined to include an upper portion in the window opening for subsequent connection to an over-lying conductive pattern.

In accordance with the principles of this invention, small contact windows may also be formed in the relatively thick intermediate insulating layer of an MOS LSI device by employing a positive resist during the lithographic patterning steps. Thus, for example, the structure shown in FIG. 10 includes a positive electron resist 44 (such as poly butene-1 sulfone) as the topmost layer thereof. As indicated in FIG. 10, a small contact opening has been formed in the resist layer 44 by, for example, chemically removing irradiated portions of the resist with an 85:15:1.2 mixture of methyl-iso-amyl ketone:2-pentanone:water, which is an effective solvent for irradiated poly butene-1 sulfone.

Figure 10:
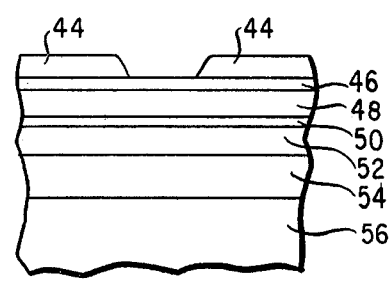
FIGS. 10 through 12 depict successive stages in the processing of still another embodiment of the present invention.

Underlying the patterned resist layer 44 of the specific illustrative structure of FIG. 10 are a grown or deposited layer 46 of silicon dioxide (which is optional), a relatively thin layer 48 of doped or undoped polysilicon, a layer 50 of silicon nitride or aluminum oxide, a doped polysilicon gate electrode 52, a layer 54 of silicon dioxide and a silicon substrate 56.

In a conventional way, an opening is formed in the layer 46 of FIG. 1 as defined by the window in the resist layer 44. Then an opening is formed in the relatively thin polysilicon layer 48 by, for example, standard wet chemical etching.

In some cases of practical importance, the layer 46 shown in FIG. 10 is omitted and it is desired to pattern the polysilicon layer 48 by standard plasma etching in, for example, a 96:4 atmosphere of carbon tetrafluoride:oxygen. But, in those cases wherein a positive electron resist has been used to form the layer 44, it has been observed that such resists as are presently available do not sufficiently withstand the plasma etching step. In seeking to solve this problem, applicants discovered that the differential etch rate between the positive electron resist (poly butene-1 sulfone) and the polysilicon layer 48 was affected in a particularly favorable way by lowering the temperature of the plasma atmosphere. In practice, applicants have found that satisfactory plasma etching of the type specified above can be carried out if the plasma temperature is maintained below about 15° C. Further, if plasma etching of the layer 48 is carried out, it is sometimes advantageous to interpose a stop layer made of silicon dioxide (not shown) between the polysilicon layer 48 and the layer 50.

The influence of lower temperature on the differential etch rate between polysilicon and the resist material was particularly pronounced for poly butene-1 sulfone. But applicants have determined that lowering the temperature of the plasma also favorably affects the differential etch rate between the polysilicon layer and a variety of positive and negative resists.

Figure 11:
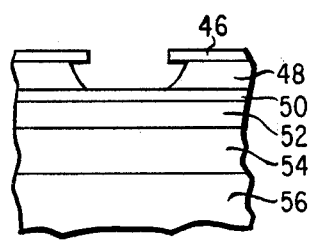
Figure 12:
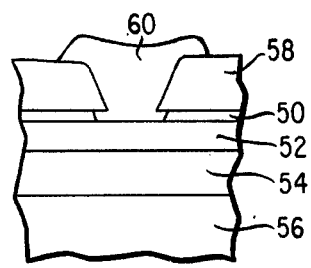

If the polysilicon layer 48 of FIG. 10 is patterned by wet chemical etching as specified above, the resulting structure then appears as shown in FIG. 11. Next, in accordance with a basic aspect of applicants' inventive principles, the entire remaining portion of the polysilicon layer 48 is thermally oxidized in accordance with the particular techniques specified above to convert it to silicon dioxide. During this step, the silicon nitride layer 50 prevents the polysilicon layer 52 from also being converted. Then the exposed portion of the layer 50 in the window region is etched away. The resulting structure is shown in FIG. 12 wherein the relatively thick silicon dioxide portion grown from the polysilicon layer 48 is designated by reference numeral 58. Due to lateral growth of the thermally grown intermediate insulating portion 58 in the side walls of the depicted window, the final size of the opening is in practice found to be slightly less than that defined initially in the resist pattern. Furthermore, for a given specified thickness of intermediate insulator, applicants' unique process requires only that a relatively thin layer (the original polysilicon layer 48) be etched. (Of course, other still thinner layers such as the layers 46 and 50 need to be etched also.) Illustratively, the thickness of the layer 48 is only about one-half the thickness of the intermediate insulating layer 58. Hence in accordance with these particular aspects of applicants' inventive process, very small contact openings are achieved with relatively relaxed lithographic and pattern transfer requirements.

Subsequently, a metallic layer, with or without a thin underlying protective layer of polysilicon, is deposited on the entire top surface of the FIG. 12 structure. After selective patterning of the metallic layer, a contact portion 60 thereof remains in electrical contact with the gate electrode 52 of FIG. 12.

Finally, it is to be understood that the above-described arrangements and procedures are only illustrative of the application of the principles of the present invention. In accordance with those principles, numerous other structural configurations and processing techniques may be devised by those skilled in the art without departing from the spirit and scope of the invention.

What is claimed is:

1. A method for forming contact windows in a multi-layered integrated-circuit device that includes underlying conductive regions to which electrical connections are to be made via contact windows that extend through a relatively thick insulating layer that overlies said underlying regions, said method comprising the steps of forming a relatively thin layer of polysilicon on said underlying conductive regions, masking selected contact window portions of said thin layer of polysilicon with a material that will prevent oxidation of the polysilicon thereunder, oxidizing said polysilicon to convert it entirely to a relatively thick insulating layer of silicon dioxide except in said contact window portions where substantially no conversion occurs, removing said masking material from said contact window portions, adding impurities to the unconverted polysilicon in said contact window portions to form conductive regions extending through said relatively thick insulating layer to contact said underlying regions, wherein said underlying regions comprise the gate, source and drain electrodes of an MOS LSI device, and wherein said masking material comprises a material selected from the group consisting of silicon nitride and aluminum oxide, said method further comprising the step of patterning said masking material by electron beam lithography utilizing direct writing techniques with a negative electron resist to form said contact window portions in said material, and wherein said oxidizing step comprises establishing a steam oxygen atmosphere at a pressure of at least one atmosphere at a suitable temperature and for a sufficient time to convert the thin layer of polysilicon to electrically insulating silicon dioxide, said method further including the step of forming a relatively thin protective layer of polysilicon on the entire top surface of said device subsequent to said removing step.

2. A method as in claim 1 further including the steps of forming a conductive layer on the entire top surface of said protective layer, and correspondingly patterning said conductive and protective layers to form electrical connections that contact said conductive regions in accordance with a prescribed pattern.

* * * * *